United States Patent
Morikawa (12)

(10) Patent No.: US 11,101,780 B2
(45) Date of Patent: Aug. 24, 2021

(54) COMPARATOR CIRCUIT

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Masaaki Morikawa, Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 138 days.

(21) Appl. No.: 16/520,116

(22) Filed: Jul. 23, 2019

(65) Prior Publication Data
US 2020/0244238 A1    Jul. 30, 2020

(30) Foreign Application Priority Data
Jan. 25, 2019 (JP) .............................. JP2019-011215

(51) Int. Cl.
  *H03F 3/45* (2006.01)
  *H03L 7/085* (2006.01)

(52) U.S. Cl.
  CPC ......... *H03F 3/45179* (2013.01); *H03L 7/085* (2013.01)

(58) Field of Classification Search
  CPC ......... H03F 3/45; H03F 3/45179; H03L 7/085
  USPC ............................................. 330/253; 327/52
  See application file for complete search history.

(56) References Cited

U.S. PATENT DOCUMENTS 8,659,322 B2    2/2014  Hoefler et al.
2014/0253205 A1 *  9/2014  Wang ................... H03K 5/2481
                                                              327/307

FOREIGN PATENT DOCUMENTS

| GB | 2336958 A | * 11/1999 | ........... H03K 5/2481 |
| JP | 2004282121 A | 10/2004 | |
| JP | 2012199664 A | 10/2012 | |
| JP | 5988348 B2 | 9/2016 | |

* cited by examiner

*Primary Examiner* — Steven J Mottola
(74) *Attorney, Agent, or Firm* — Holtz, Holtz & Volek PC

(57) ABSTRACT

According to an embodiment, a comparator circuit includes first and second PMOS transistors that compose a differential pair, a first switching transistor with a main current path that is connected between an input terminal and a gate of the first PMOS transistor, a voltage source that applies a reference voltage to a gate of the second PMOS transistor, and a first bias circuit that applies a first bias voltage to a control electrode of the first switching transistor.

20 Claims, 2 Drawing Sheets

COMPARATOR CIRCUIT

CROSS-REFERENCE TO RELATED APPLICATIONS

This application is based upon and claims the benefit of priority from Japanese Patent Application No. 2019-011215, filed on Jan. 25, 2019; the entire contents of which are incorporated herein by reference.

FIELD

The present embodiment generally relates to a comparator circuit.

BACKGROUND

A variety of techniques that deal with characteristic degradation that is caused by Negative Bias Temperature Instability (NBTI) in a comparator circuit that uses PMOS transistors as a differential pair are disclosed conventionally. In a PMOS transistor, NBTI causes characteristic degradation that causes a threshold value to vary in a state where a drain voltage is higher than a gate voltage. Hence, a comparator circuit is desired that is capable of suppressing a rise in a drain voltage of a PMOS transistor and readily avoiding transferring to NBTI.

DETAILED DESCRIPTION

According to one embodiment, a comparator circuit includes first and second PMOS transistors that compose a differential pair, a first switching transistor with a main current path that is connected between an input terminal and a gate of the first PMOS transistor, a voltage source that applies a reference voltage to a gate of the second PMOS transistor, and a first bias circuit that applies a first bias voltage to a control electrode of the first switching transistor.

Hereinafter, a comparator circuit according to embodiments will be explained in detail with reference to the accompanying drawings. Additionally, the present invention is not limited by such embodiments.

First Embodiment

Figure 1:
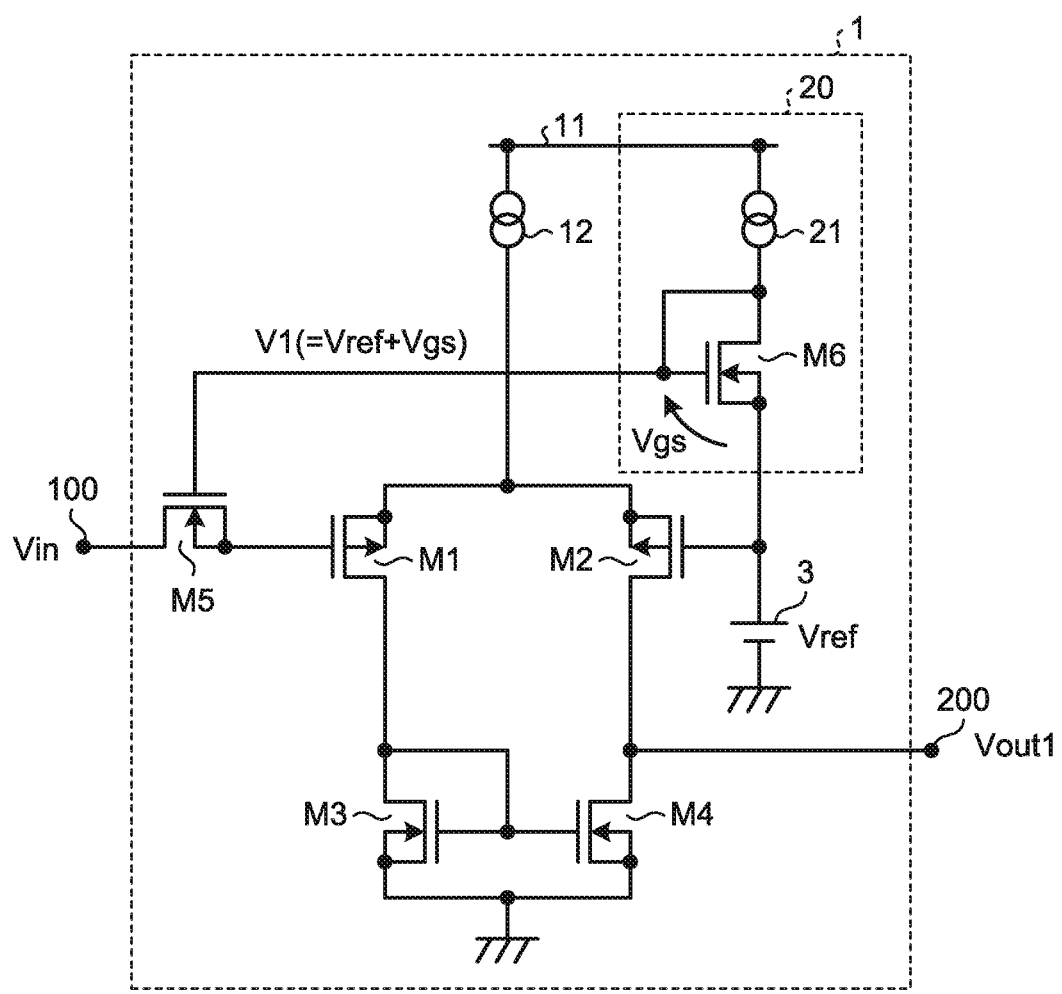
FIG. 1 is a diagram illustrating a comparator circuit according to a first embodiment.

FIG. 1 is a diagram illustrating a comparator circuit according to a first embodiment. In the first embodiment, for example, a case where an input voltage Vin is lower than a reference voltage Vref is detected as abnormality. A comparator circuit 1 has PMOS transistors M1 and M2 that compose a differential pair. Sources of the PMOS transistors M1 and M2 are commonly connected to one terminal of a current source 12. The other terminal of the current source 12 is connected to a power source line 11. A gate of the PMOS transistor M1 is connected to an input terminal 100 where an input voltage Vin is applied thereto via an NMOS transistor M5. A gate of the PMOS transistor M2 is connected to a reference voltage source 3 that supplies a reference voltage Vref thereto.

A source-drain path of the NMOS transistor M5 that is a main current path is connected between the input terminal 100 and the gate of the PMOS transistor M1. A drain of the NMOS transistor M5 is connected to the input terminal 100 and a source thereof is connected to the gate of the PMOS transistor M1. A bias voltage V1 is applied to a gate of the NMOS transistor M5 by a bias circuit 20.

The bias circuit 20 has a diode-connected NMOS transistor M6. A drain and a gate of the NMOS transistor M6 are connected to one terminal of a constant current source 21 and a source thereof is connected to a reference voltage source 3. The other terminal of the constant current source 21 is connected to the power source line 11. A gate voltage of the NMOS transistor M6 is a voltage that is higher than a reference voltage Vref by a gate-source voltage Vgs of the NMOS transistor M6. Therefore, a bias voltage V1 is Vref+Vgs.

It has an NMOS transistor M3 with a source-drain path that is a main current path that is connected between a drain of the PMOS transistor M1 and ground. The NMOS transistor M3 composes diode connection where a drain and a gate thereof are commonly connected.

It has an NMOS transistor M4 with a source-drain path that is a main current path that is connected between a drain of the PMOS transistor M2 and ground. A gate of the NMOS transistor M4 is connected to a gate of the NMOS transistor M3. The NMOS transistors M3 and M4 compose a current mirror circuit.

A connection point between the PMOS transistor M2 and the NMOS transistor M4 is connected to an output terminal 200. The output terminal 200 outputs an output voltage Vout1.

An operation is as follows. An input voltage Vin is applied to a gate of the PMOS transistor M1 via the source-drain path of the NMOS transistor M5. In a steady state, that is, a state where an input voltage Vin is higher than a reference voltage Vref, the PMOS transistor M2 is in an on-state and an output voltage Vout1 is High.

As an input voltage Vin rises to be higher than Vref+Vgs−Vth(M5), the NMOS transistor M5 is in an off-state. Herein, Vth(M5) represents a threshold value of the NMOS transistor M5.

As the NMOS transistor M5 is turned off, an input voltage Vin is not applied to the gate of the PMOS transistor M1. That is, it is possible to restrict an upper limit value of a voltage that is applied to the gate of the PMOS transistor M1, by a value of a bias voltage V1. In other words, the NMOS transistor M5 functions as a switch that restricts a voltage that is applied to the gate of the PMOS transistor M1, depending on a value of a bias voltage V1. It is possible to restrict a voltage difference between the gates of the PMOS transistors M1 and M2 and thereby execute control in such a manner that the PMOS transistor M2 is not completely in an on-state.

The PMOS transistor M2 avoids a state where it is completely turned on, so that a rise in a drain voltage is suppressed. Thereby, it is possible for the PMOS transistor M2 to avoid a drain voltage that is higher than a gate voltage, so that it is possible to avoid transferring to an NBTI state.

As an input voltage Vin falls to be lower than Vref+Vgs−Vth(M5), the NMOS transistor M5 is in an on-state. As the NMOS transistor M5 is turned on, an input voltage Vin is applied to the gate of the PMOS transistor M1.

The PMOS transistor M1 is turned on as a gate voltage thereof is lower than a reference voltage Vref. Thereby, gate voltages of the NMOS transistors M3 and M4 rise to cause turning on thereof. As the NMOS transistor M4 is turned on, an output voltage Vout is Low. That is, an output voltage Vout that is Low is detected, so that it is possible to detect an abnormal state where an input voltage Vin is lower than a reference voltage Vref.

A drain voltage of the PMOS transistor M1 at a time of turning on is a gate-source voltage of the diode-connected NMOS transistor M3. Thereby, when the PMOS transistor M1 is turned on, a state where a drain voltage is higher than a gate voltage is avoided, so that it is possible to avoid transferring to an NBTI state.

It is possible to appropriately set a bias voltage V1 at a value in such a manner that the PMOS transistor M2 is not in a complete on-state. A highest voltage that is applied to the gate of the PMOS transistor M1 is restricted to be a voltage that is lower than a bias voltage V1 by a threshold value Vth(M5) of the NMOS transistor M5. That is, it is restricted by Vref+Vgs−Vth(M5).

For example, as a voltage that corresponds to Vgs in a bias voltage V1 is raised, an upper limit value of a voltage that is applied to the gate of the PMOS transistor M1 is raised. An on-state of the PMOS transistor M2 is controlled by a difference between a reference voltage Vref and a voltage that is applied to the gate of the PMOS transistor M1. Therefore, it is possible to provide a configuration to adjust a bias voltage V1 appropriately in such a manner that the PMOS transistor M2 is not tuned on completely. It is possible to readily adjust Vgs in a bias voltage V1 by, for example, a dimension of the NMOS transistor M6 or a current value of the constant current source 21.

A bias voltage V1 is set at, for example, a value in such a manner that the NMOS transistor M5 is in an on-state even when an input voltage Vin is equal to a reference voltage Vref. Thereby, it is possible to compare a magnitude relationship between an input voltage Vin and a reference voltage Vref accurately. Specifically, a bias voltage V1 is set so as to be greater than or equal to a voltage provided by adding a threshold value Vth(M5) of the NMOS transistor M5 to a reference voltage Vref.

According to the first embodiment, it includes the NMOS transistor M5 that functions as a switch that restricts an upper limit value of a voltage that is applied to the gate of the PMOS transistor M1, by a bias voltage V1 that is set by the bias circuit 20. Thereby, a rise in a drain voltage of the PMOS transistor M2 is suppressed, so that it is possible to readily avoid transferring to an NBTI state in a steady state where an input voltage Vin is higher than a reference voltage Vref. Furthermore, in a case where an input voltage Vin is lower than a reference voltage Vref and the PMOS transistor M1 is in an on-state, a rise in a drain voltage of the PMOS transistor M1 is suppressed, so that it is possible to avoid being in an NBTI state.

That is, in an active state where an operation of comparison between an input voltage Vin and a reference voltage Vref is executed, it is possible to readily avoid being in an NBTI state for any of the PMOS transistors M1 and M2 that are in on-states and it is possible to provide the comparator circuit 1 with high reliability.

An output voltage Vout1 indicates High that corresponds to a drain voltage of the PMOS transistor M2 at a time of an on-state or Low that corresponds to a voltage that is substantially equal to a ground potential at a time when the NMOS transistor M4 is in an on-state. Hence, a dynamic range of an output voltage Vout1 is wide.

Second Embodiment

Figure 2:
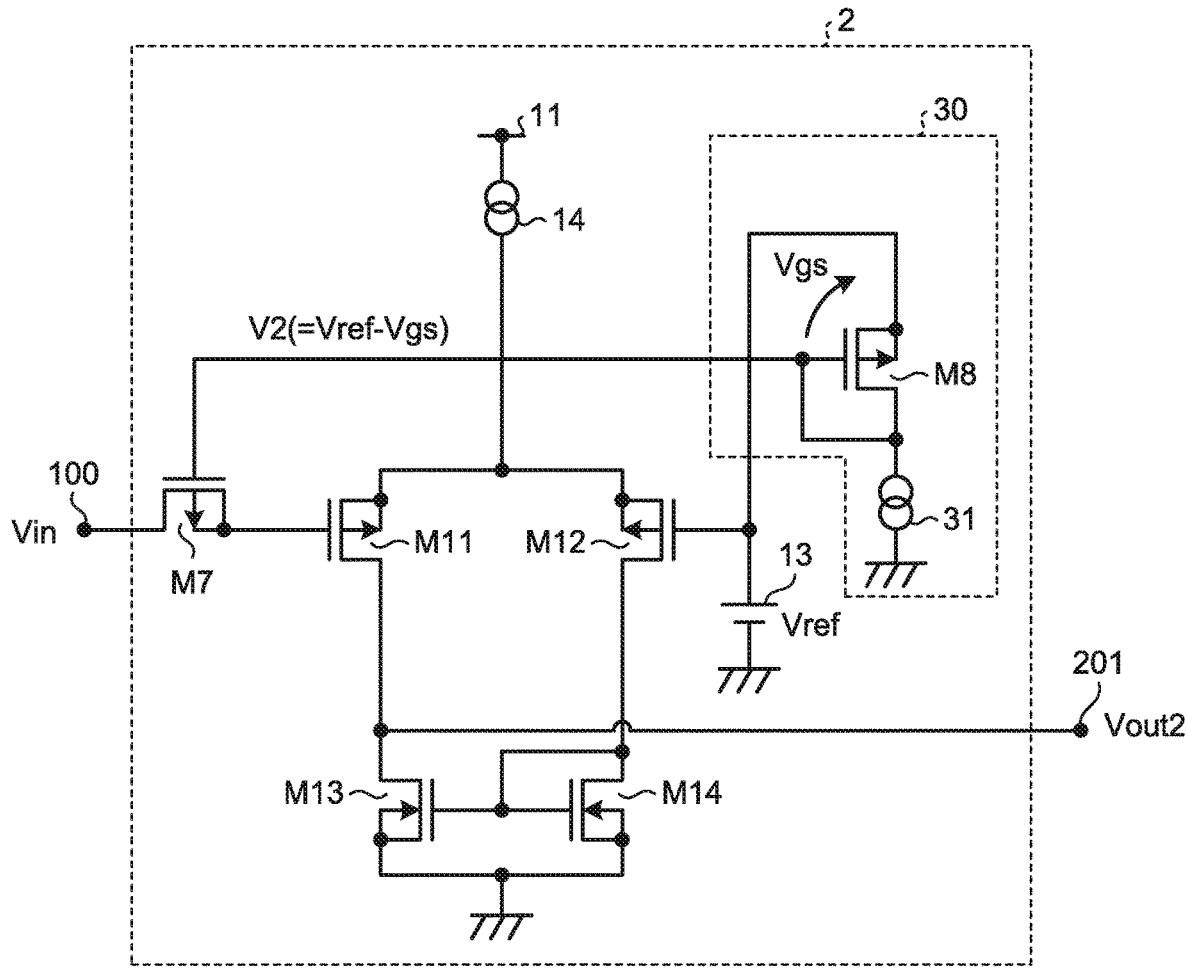
FIG. 2 is a diagram illustrating a comparator circuit according to a second embodiment.

FIG. 2 is a diagram illustrating a comparator circuit according to a second embodiment. A component that corresponds to that of the embodiment as already described will be provided with an identical sign and a redundant description will be provided only in case of need. Hereinafter, the same applies. In the second embodiment, a state where an input voltage Vin is higher than a reference voltage Vref is detected as a state where abnormality is caused.

A comparator circuit 2 has PMOS transistors M11 and M12 that compose a differential pair. Sources of the PMOS transistors M11 and M12 are commonly connected to one terminal of a current source 14. The other terminal of the current source 14 is connected to a power source line 11. A gate of the PMOS transistor M11 is connected to an input terminal 100 where an input voltage Vin is applied thereto via a PMOS transistor M7. A gate of the PMOS transistor M12 is connected to a reference voltage source 13 that supplies a reference voltage Vref thereto.

A source-drain path of the PMOS transistor M7 that is a main current path is connected between the input terminal 100 and the gate of the PMOS transistor M11. A drain of the PMOS transistor M7 is connected to the input terminal 100 and a source thereof is connected to the gate of the PMOS transistor M11. A bias voltage V2 is applied to a gate of the PMOS transistor M7 by a bias circuit 30.

The bias circuit 30 has a diode-connected PMOS transistor M8. A drain and a gate of the PMOS transistor M8 are connected to one terminal of a constant current source 31 and a source thereof is connected to a reference voltage source 13. The other terminal of the constant current source 31 is grounded. A gate voltage of the PMOS transistor M8 is a voltage that is lower than a reference voltage Vref by a gate-source voltage Vgs of the PMOS transistor M8. Therefore, a bias voltage V2 is Vref−Vgs.

It has an NMOS transistor M13 with a source-drain path that is a main current path that is connected between a drain of the PMOS transistor M11 and ground.

It has an NMOS transistor M14 with a source-drain path that is a main current path that is connected between a drain of the PMOS transistor M12 and ground. The NMOS transistor M14 composes diode connection where a drain and a gate thereof are commonly connected. A gate of the NMOS transistor M14 is connected to a gate of the NMOS transistor M13. The NMOS transistors M13 and M14 compose a current mirror circuit.

A connection point between the PMOS transistor M11 and the NMOS transistor M13 is connected to an output terminal 201. The output terminal 201 outputs an output voltage Vout2.

As a gate-source voltage of the PMOS transistor M8 is Vgs and a reference voltage Vref is supplied by the reference voltage source 13, a bias voltage V2 that is supplied to the gate of the PMOS transistor M7 is represented by Vref−Vgs.

An operation is as follows. In a steady state, a state where an input voltage Vin is lower than a reference voltage Vref is provided. In such a state, the PMOS transistor M11 is in an on-state and an output voltage Vout2 indicates High.

As an input voltage Vin falls and a voltage difference between a bias voltage V2 (=Vref−Vgs) that is applied to the gate of the PMOS transistor M7 and a source voltage of the PMOS transistor M7 is less than a threshold value Vth(M7) of the PMOS transistor M7, the PMOS transistor M7 is turned off. As the PMOS transistor M7 is turned off, an input voltage Vin is not applied to the gate of the PMOS transistor M11. That is, it is possible to restrict a lower limit of a voltage that is applied to the gate of the PMOS transistor M11, by a bias voltage V2.

In other words, the PMOS transistor M7 functions as a switch that restricts a voltage that is applied to the gate of the PMOS transistor M11, depending on a value of a bias voltage V2. It is possible to restrict a voltage difference between gates of the PMOS transistors M11 and M12 and thereby execute control in such a manner that the PMOS transistor M11 is not completely in an on-state.

The PMOS transistor M11 avoids a state where it is completely turned on, so that a rise in a drain voltage is suppressed. Thereby, it is possible for the PMOS transistor M11 to avoid a drain voltage that is higher than a gate voltage, so that it is possible to avoid transferring to an NBTI state.

As an input voltage Vin rises and a gate voltage of the PMOS transistor M11 is higher than a reference voltage Vref, the PMOS transistor M12 is turned on. As the PMOS transistor M12 is turned on, a gate voltage of the NMOS transistor M14 rises and the NMOS transistors M13 and M14 are turned on. Thereby, an output voltage Vout2 is Low. As an output voltage Vout2 is Low, it is possible to detect an abnormal state where an input voltage Vin is higher than a reference voltage Vref.

A drain voltage of the PMOS transistor M12 at a time of turning on is a gate-source voltage of the diode-connected NMOS transistor M14. Thereby, when the PMOS transistor M12 is turned on, a state where a drain voltage is higher than a gate voltage is avoided, so that it is possible to avoid transferring to an NBTI state.

It is possible to appropriately set a bias voltage V2 at a value in such a manner that the PMOS transistor M11 is not in a complete on-state. A lowest voltage that is applied to the gate of the PMOS transistor M11 is restricted to be a voltage that is higher than a bias voltage V2 by a threshold value Vth(M7) of the PMOS transistor M7. That is, it is restricted by Vref−Vgs+Vth(M7).

For example, as a voltage that corresponds to Vgs in a bias voltage V2 is raised, a lower limit value of a voltage that is applied to the gate of the PMOS transistor M11 is lowered. An on-state of the PMOS transistor M11 is controlled by a difference between a reference voltage Vref and a voltage that is applied to the gate of the PMOS transistor M11. Therefore, it is possible to provide a configuration to adjust a bias voltage V2 appropriately in such a manner that the PMOS transistor M11 is not tuned on completely. It is possible to readily adjust Vgs in a bias voltage V2 by, for example, a dimension of the PMOS transistor M8 or a current value of the constant current source 31.

A bias voltage V2 is set at, for example, a value in such a manner that the PMOS transistor M7 is in an on-state even when an input voltage Vin is equal to a reference voltage Vref. Thereby, it is possible to compare a magnitude relationship between an input voltage Vin and a reference voltage Vref accurately. Specifically, a bias voltage V2 is set so as to be less than or equal to a voltage provided by subtracting a threshold value Vth(M7) of the PMOS transistor M7 from a reference voltage Vref.

According to the second embodiment, it includes the PMOS transistor M7 that functions as a switch that restricts a lower limit value of a voltage that is applied to the gate of the PMOS transistor M11, by a bias voltage V2 that is set by the bias circuit 30. Thereby, a rise in a drain voltage of the PMOS transistor M11 is suppressed, so that it is possible to readily avoid transferring to an NBTI state in a steady state where an input voltage Vin is lower than a reference voltage Vref.

Furthermore, in a case where an input voltage Vin is higher than a reference voltage Vref and the PMOS transistor M12 is in an on-state, a rise in a drain voltage of the PMOS transistor M12 is suppressed, so that it is possible to avoid being in an NBTI state.

That is, in an active state where an operation of comparison between an input voltage Vin and a reference voltage Vref is executed, it is possible to avoid being in an NBTI state for any of the PMOS transistors M11 and M12 that are in on-states and it is possible to provide the comparator circuit 2 with high reliability.

An output voltage Vout2 indicates High that corresponds to a drain voltage of the PMOS transistor M11 at a time of an on-state or Low that corresponds to a voltage that is substantially equal to a ground potential at a time when the NMOS transistor M13 is in an on-state. Hence, a dynamic range of an output voltage Vout2 is wide.

Third Embodiment

Figure 3:
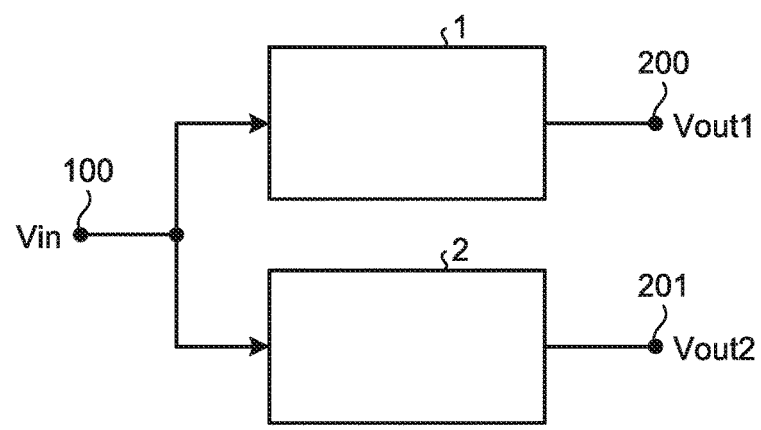
FIG. 3 is a diagram illustrating a comparator circuit according to a third embodiment.

FIG. 3 is a diagram illustrating a comparator circuit according to a third embodiment. The present embodiment includes the comparator circuit 1 according to the first embodiment and the comparator circuit 2 according to the second embodiment as already described. Configurations and operations of the respective comparator circuits 1 and 2 are as already described.

An output voltage Vout1 of the comparator circuit 1 is Low in a state where a voltage that is applied to the gate of the PMOS transistor M1 is lower than a reference voltage Vref. Specifically, as an input voltage Vin is lower than a voltage provided by subtracting a threshold value Vth(M5) of the NMOS transistor M5 from a bias voltage V1, an output voltage Vout1 is Low.

On the other hand, an output voltage Vout2 of the comparator circuit 2 is Low in a state where an input voltage Vin is higher than a reference voltage Vref. Specifically, as an input voltage Vin is higher than a voltage provided by adding a threshold value Vth(M7) of the PMOS transistor M7 to a bias voltage V2, an output voltage Vout2 is Low.

Therefore, as bias voltages V1 and V2 are adjusted appropriately, it is possible to set a state where both output voltages Vout1 and Vout2 indicate Low in a range of ±ΔV centered at a reference voltage Vref. Thereby, it is possible to provide a configuration of a window comparator circuit to detect that an input voltage Vin is within a predetermined range with respect to a reference voltage Vref. Additionally, +ΔV represents a difference between Vgs and a threshold value Vth(M5) of the NMOS transistor M5 in the bias circuit 20 and −ΔV corresponds to a difference between Vgs and a threshold value Vth(M7) of the PMOS transistor M7 in the bias circuit 30.

According to the third embodiment, when both output voltages Vout1 and Vout2 are Low, that is, both output voltages Vout1 and Vout2 are High, a window comparator circuit is configured to detect that an input voltage Vin is within a predetermined range centered at a reference voltage Vref.

It is possible for the respective comparator circuits 1 and 2 to readily avoid transferring to NBTI states at a time when the PMOS transistors M1 and M2 and M11 and M12 in the respective differential pairs are in on-sates in an active state where an operation of comparison between an input voltage Vin and a reference voltage Vref is executed, by adjustment of bias voltages V1 and V2. Hence, it is possible to prevent characteristic degradation that is involved with a variation of a threshold value, so that it is possible to provide a window comparator circuit with high reliability.

Additionally, a range of an input voltage Vin may appropriately be set by appropriately adjusting reference voltages Vref of the comparator circuit 1 and the comparator circuit 2 to be different voltage values.

Furthermore, output voltages Vout1 and Vout2 may be supplied to an AND circuit (non-illustrated) and an input voltage Vin that is within a predetermined range at a time when an output signal of such an AND circuit is Low may be detected.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A comparator circuit, comprising:
   first and second PMOS transistors that compose a differential pair;
   a first switching transistor with a main current path that is connected between an input terminal and a gate of the first PMOS transistor;
   a first voltage source that applies a first reference voltage to a gate of the second PMOS transistor; and
   a first bias circuit that applies a first bias voltage to a control electrode of the first switching transistor,
   wherein:
   the first switching transistor is composed of an NMOS transistor, and
   the first bias voltage is set to be higher than the first reference voltage by a predetermined voltage.

2. The comparator circuit according to claim 1, wherein:
   the first bias circuit has:
      a diode-connected NMOS transistor; and
      a first current source that is connected to a drain of the diode-connected NMOS transistor, and
   a gate of the diode-connected NMOS transistor is connected to a gate of the first switching transistor.

3. The comparator circuit according to claim 1, further comprising:
   a current mirror circuit that has first and second NMOS transistors with respective main current paths that are connected between drains of the first and second PMOS transistors and ground,
   wherein:
   a drain and a gate of the first NMOS transistor are connected to the drain of the first PMOS transistor,
   a drain of the second NMOS transistor is connected to the drain of the second PMOS transistor,
   gates of the first and second NMOS transistors are commonly connected,
   sources of the first and second NMOS transistors are grounded, and
   a drain of the second NMOS transistor is connected to an output terminal.

4. The comparator circuit according to claim 1, further comprising:
   third and fourth PMOS transistors that compose a differential pair;
   a second switching transistor with a main current path that is connected between the input terminal and a gate of the third PMOS transistor;
   a second voltage source that applies a second reference voltage to a gate of the fourth PMOS transistor; and
   a second bias circuit that applies a second bias voltage to a control electrode of the second switching transistor.

5. The comparator circuit according to claim 4, wherein:
   the second switching transistor is composed of a PMOS transistor, and
   the second bias voltage is set to be lower than the second reference voltage by a predetermined voltage.

6. The comparator circuit according to claim 5, wherein:
   the second bias circuit has:
      a diode-connected PMOS transistor; and
      a second current source that is connected to a drain of the diode-connected PMOS transistor, and
   a gate of the diode-connected PMOS transistor is connected to a gate of the second switching transistor.

7. The comparator circuit according to claim 4, wherein the first reference voltage and the second reference voltage are set at an identical voltage value.

8. The comparator circuit according to claim 4, wherein the first reference voltage and the second reference voltage are set at different voltage values.

9. A comparator circuit, comprising:
   first and second PMOS transistors that compose a differential pair;
   a first switching transistor with a main current path that is connected between an input terminal and a gate of the first PMOS transistor;
   a first voltage source that applies a first reference voltage to a gate of the second PMOS transistor; and
   a first bias circuit that applies a first bias voltage to a control electrode of the first switching transistor,
   wherein:
   the first switching transistor is composed of a PMOS transistor, and
   the first bias voltage is set to be lower than the first reference voltage by a predetermined voltage.

10. The comparator circuit according to claim 9, wherein:
    the first bias circuit has:
       a diode-connected PMOS transistor; and
       a second current source that is connected to a drain of the diode-connected PMOS transistor, and
    a gate of the diode-connected PMOS transistor is connected to a gate of the first switching transistor.

11. The comparator circuit according to claim 9, further comprising:
    a current mirror circuit that has first and second NMOS transistors with respective main current paths that are connected between drains of the first and second PMOS transistors and ground,
    wherein:
    a drain of the first NMOS transistor is connected to the drain of the first PMOS transistor,
    a drain and a gate of the second NMOS transistor are connected to the drain of the second PMOS transistor,
    gates of the first and second NMOS transistors are commonly connected,
    sources of the first and second NMOS transistors are grounded, and
    a drain of the first NMOS transistor is connected to an output terminal.

12. The comparator circuit according to claim 9, further comprising:
    third and fourth PMOS transistors that compose a differential pair;
    a second switching transistor with a main current path that is connected between the input terminal and a gate of the third PMOS transistor;

a second voltage source that applies a second reference voltage to a gate of the fourth PMOS transistor; and a second bias circuit that applies a second bias voltage to a control electrode of the second switching transistor.

13. The comparator circuit according to claim 12, wherein the first reference voltage and the second reference voltage are set at an identical voltage value.

14. The comparator circuit according to claim 12, wherein the first reference voltage and the second reference voltage are set at different voltage values.

15. The comparator circuit according to claim 12, wherein:

the second switching transistor is composed of an NMOS transistor, and the second bias voltage is set to be higher than the second reference voltage by a predetermined voltage.

16. The comparator circuit according to claim 15, wherein:

the second bias circuit has:
a diode-connected NMOS transistor; and
a current source that is connected to a drain of the diode-connected NMOS transistor, and a gate of the diode-connected NMOS transistor is connected to a gate of the second switching transistor.

17. A comparator circuit, comprising:

a first comparator circuit that compares an input voltage with a first reference voltage; and a second comparator circuit that compares the input voltage with a second reference voltage, wherein:

the first comparator circuit includes:
first and second PMOS transistors that compose a differential pair;
a first switching transistor with a main current path that is connected between an input terminal where the input voltage is applied thereto and a gate of the first PMOS transistor;
a first voltage source that applies the first reference voltage to a gate of the second PMOS transistor; and
a first bias circuit that applies a first bias voltage to a control electrode of the first switching transistor, the second comparator circuit includes:
third and fourth PMOS transistors that compose a differential pair;
a second switching transistor with a main current path that is connected between the input terminal and a gate of the third PMOS transistor;
a second voltage source that applies the second reference voltage to a gate of the fourth PMOS transistor; and
a second bias circuit that applies a second bias voltage to a control electrode of the second switching transistor, the first switching transistor is composed of an NMOS transistor, the first bias voltage is set to be higher than the first reference voltage by a predetermined voltage, the second switching transistor is composed of a PMOS transistor, and the second bias voltage is set to be lower than the second reference voltage by a predetermined voltage.

18. The comparator circuit according to claim 17, wherein:

the first bias circuit has:
a diode-connected NMOS transistor; and
a first current source that is connected to a drain of the diode-connected NMOS transistor, a gate of the diode-connected NMOS transistor is connected to a gate of the first switching transistor, the second bias circuit has:
a diode-connected PMOS transistor; and
a second current source that is connected to a drain of the diode-connected PMOS transistor, and a gate of the diode-connected PMOS transistor is connected to a gate of the second switching transistor.

19. The comparator circuit according to claim 17, wherein the first reference voltage and the second reference voltage are set at an identical voltage value.

20. The comparator circuit according to claim 17, wherein the first reference voltage and the second reference voltage are set at different voltage values.

* * * * *